(12) United States Patent
Jeon et al.

(10) Patent No.: US 6,256,432 B1
(45) Date of Patent: Jul. 3, 2001

(54) POLARIZATION INDEPENDENT ALL-OPTICAL DEMULTIPLEXER

(75) Inventors: Min-Yong Jeon; Hak Kyu Lee; Dong Sung Lim; Joon-Tae Ahn; Kyoung-Hon Kim, all of Taejon (KR)

(73) Assignee: Electronics and Telecommunications Research Institute, Taejon (KR)

( * ) Notice: Subject to any disclaimer, the term of this patent is extended or adjusted under 35 U.S.C. 154(b) by 0 days.

(21) Appl. No.: 09/382,456

(22) Filed: Aug. 25, 1999

(30) Foreign Application Priority Data

Dec. 2, 1998 (KR) .............................. 1998-52564

(51) Int. Cl.$^7$ ...................................... G02B 6/28
(52) U.S. Cl. ........................... 385/24; 359/156; 359/160; 359/173
(58) Field of Search ............... 385/24; 359/127, 359/156, 160, 161, 179, 188, 195, 173

(56) References Cited

U.S. PATENT DOCUMENTS

| | | | |
|---|---|---|---|
| 5,357,359 | 10/1994 | Uchiyama et al. | 359/123 |
| 5,457,559 | 10/1995 | Saito et al. | 359/135 |
| 5,646,759 | 7/1997 | Lichtman et al. | 359/138 |
| 6,008,915 | * 12/1999 | Zyskind . | |
| 6,097,535 | * 8/2000 | Terahara . | |
| 6,151,145 | * 11/2000 | Sivastava et al. . | |

OTHER PUBLICATIONS

Blow et al., "Demonstration Of The Nonlinear Fibre Loop Mirror As An Ultrafast All–Optical Demultiplexer," *IEEE Electronics Letters*, 26(14):962–964, Jul. 1990.

Diez et al. "All–optical switch for TDM and WDM/TDM systems demonstrated in a 640Gbit/s demultiplexing experiment," *IEEE Electronics Letters*, 34(8):803–805, Apr. 16, 1998.

Hedekvist et al., "Fiber Four–Wave Mixing Demultiplexing with Inherent Parametric Amplification," *Journal of Lightwave Technology*, 15(11):2051–2058, Nov. 1997.

* cited by examiner

*Primary Examiner*—Hung N. Ngo
(74) *Attorney, Agent, or Firm*—E. Russell Tarleton; Seed IP Law Group, PLLC

(57) ABSTRACT

The present invention provides a demultiplexer for generating a constant four-wave-mixing beam without regard to an input polarization state using a dispersion-shifted fiber that is a nonlinear material with high refractive index. A number of parts in conventional demultiplexer implementations, which are sensitive to input polarization state has been replaced with optical fibers of high polarization mode dispersion.

10 Claims, 2 Drawing Sheets

POLARIZATION INDEPENDENT ALL-OPTICAL DEMULTIPLEXER

BACKGROUND OF THE INVENTION

1. Field of the Invention

The present invention relates to a polarization-independent optical demultiplexer, more particularly to the demultiplexer generating a constant four-wave-mixing beam without regard to an input polarization state using a dispersion-shifted fiber that is a nonlinear material with high refractive index.

2. Description of the Conventional Art

To meet upcoming demands in high-capacity multimedia application area using a high-speed optical communication network, powerful networks, that is, networks as fast as terabit/sec are needed. Various technologies are used to implement high-capacity optical networks that manipulate time-division-multiplexed signals. The demultiplexers are active components and demultiplex multiplexed optical signals with respect to channels. The demultiplexer is one of the components that require largest bandwidths in communication systems. The detailed operations and implementations regarding conventional optical demultiplexers are illustrated in the following references.

REFERENCES

1. U.S. patent documents
U.S. Pat. No. 05,457,559, Oct. 10, 1995, Apparatus for extracting an optical clock and apparatus for demultiplexing a time-division multiplexed signal.
U.S. Pat. No. 05,357,359, Oct. 18, 1994, Optical polarization-independent optical time division multiplexer and demultiplexer with birefringence compensation.
U.S. Pat. No 05,646,759, Jul. 8, 1997, Fiber loop mirror for time division demultiplexing.
2. Other publications
IEEE Journal of Lightwave Technology, Vol. 15, No. 11, November 1997, pp. 2051–2058, P. O. Hedekvist, M. Karlsson, and P. A. Andrekson, "Fiber four-wave demultiplexing with inherent parametric amplification".
IEEE Electronics Letters, Vol. 26, No. 14, July 1990, pp. 962–964, K. J. Blow, N. J. Doran, and B. P. Nelson, "Demonstration of the nonlinear fiber loop mirror as an ultrafast optical demultiplexer".
IEEE Electronics Letters, Vol. 34, No. 8, April 1998, pp. 803–805, S. Diez, R. Ludwig, and H. G. Weber, "Optical switch for TDM and WDM/TDM system demonstrated in a 640 Gbits/s demultiplexing experiment".

SUMMARY OF THE INVENTION

According to an aspect of this invention, the polarization-independent optical demultiplexer with four-wave-mixing includes input beams, a first optical amplifier, a second optical amplifier, a first band pass filter, a second band pass filter, a 3-dB optical fiber coupler, a dispersion-shifted fiber, and a third band pass filter. The input beams include a pump beam and a signal beam. The first optical amplifier and a second optical amplifier amplify the input beams. The first band pass filter and the second band pass filter remove noises from the amplified spontaneous emission. The 3-dB optical fiber coupler combines the output signals of the first and the second band pass filters and generates two optical signals. The dispersion-shifted fiber generates a constant four-wave-mixing beam without regard to an input polarization state because polarization state of the output signal of the 3-dB optical fiber coupler gets scrambled. The third band pass filter demultiplexes a four-wave-mixing beam generated by the dispersion-shifted fiber.

According to other aspect of the polarization-independent optical demultiplexer with four-wave-mixing comprises input beams, a first optical amplifier, a second optical amplifier, a first band pass filter, a second band pass filter, a wavelength division multiplexing (WDM) optical coupler, a dispersion-shifted fiber, a 3-dB optical fiber coupler, an optical circulator. The input beams include a pump beam and a signal beam. The first optical amplifier and the second optical amplifier amplify the input beams. The first band pass filter and the second band pass filter remove noises from the amplified spontaneous emission (ASE). The WDM optical coupler divides the output optical signals of said first band pass filter into a first optical signal and a second optical signal. The dispersion-shifted fiber generates a constant four-wave-mixing beam without regard to an input polarization state of the first optical signal from the WDM optical coupler. The 3-dB optical fiber coupler combines the four-wave-mixing beam generated by the dispersion-shifted fiber with the second optical signal of the WDM optical coupler and generates a first optical signal and a second optical signal. The optical circulator rotates the first optical signal of the 3-dB optical fiber coupler and the output optical signal of the second band pass filter and makes output.

BRIEF DESCRIPTION OF THE DRAWINGS

Several preferred embodiments of the polarization-independent optical demultiplexer according to the present invention will be explained with reference to the accompanying drawings, in which.

DETAILED DESCRIPTION OF THE PREFERRED EMBODIMENTS

Figure 1:
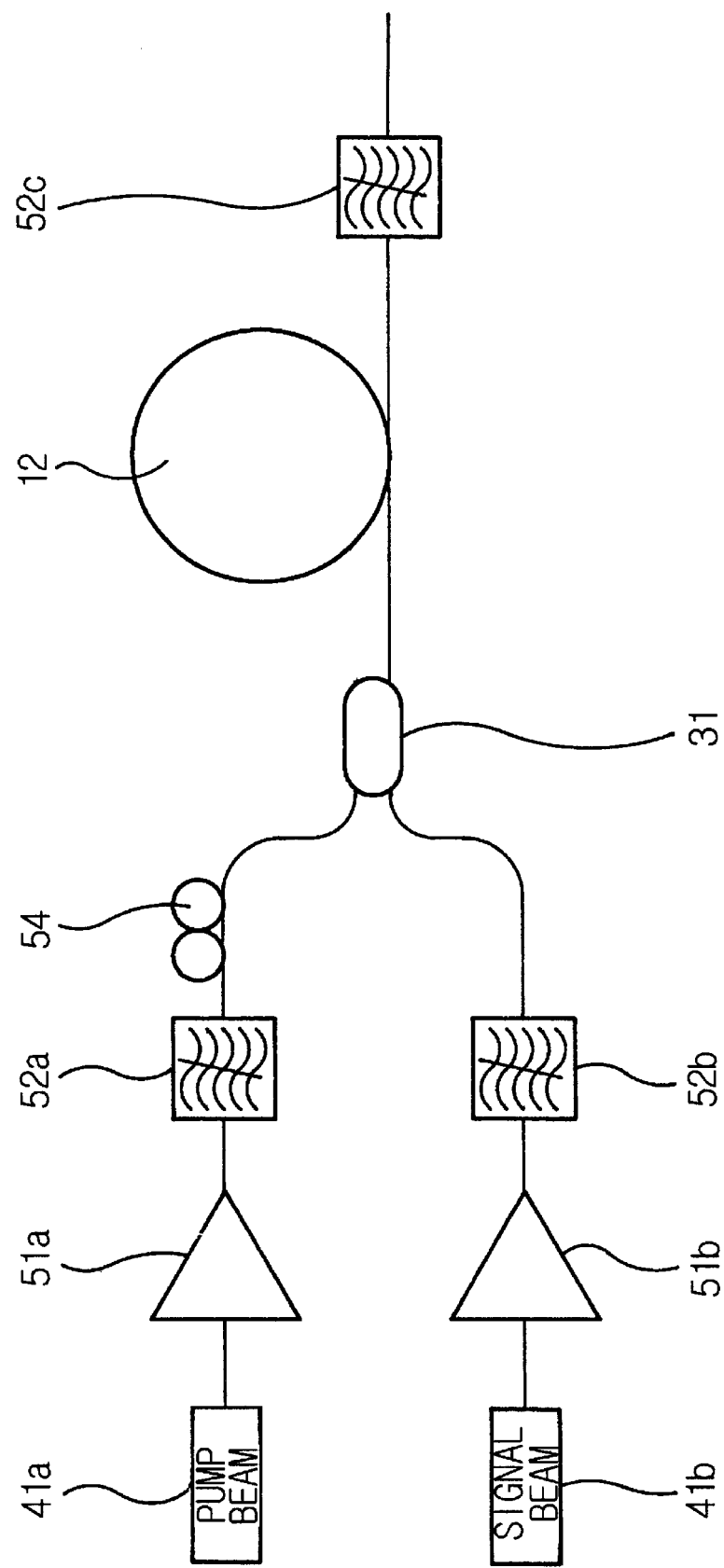
FIG. 1 shows a block diagram for explaining a polarization-independent optical demultiplexer in accordance with the first embodiment of the present invention.

Referring to FIG. 1, the polarization-independent optical demultiplexer in accordance with the first embodiment of the present invention will be specifically explained.

As shown in the figure, the polarization-independent optical demultiplexer according to the first embodiment includes input beams, a first optical amplifier 51a, a second optical amplifier 51b, a first band pass filter 52a, a second band pass filter 52b, a polarization controller 54, a 3-dB optical fiber coupler 31, a dispersion-shifted fiber 12, and a third band pass filter 52c. The input beams comprise a pump beam 41a and a signal beam 41b. The first optical amplifier 51a and the second optical amplifier 51b amplify the pump beam 41a and the signal beam 41b, respectively. The first band pass filter 52a and the second band pass filter 52b remove noises from the amplified spontaneous emission. The polarization controller 54 controls polarization output optical signals of the first band pass filter 52a. A 3-dB optical fiber coupler 31 is equipped with input optical fibers extended from the second band pass filter 52b and the polarization controller 54, and thereby combines output signals of the polarization controller 54 with output signals of the second band pass filter 52b. The dispersion-shifted fiber 12 generates a constant four-wave-mixing beam without regard to the input polarization state. The third band pass filter 52c demultiplexes a four-wave-mixing beam generated by the dispersion-shifted fiber 12.

The operation of the polarization-independent optical demultiplexer in the first embodiment in accordance with the present invention is explained as follows.

Generally, polarization mode dispersion of optical fibers occurs due to the speed difference between polarization principle axes of optical fiber. Polarization-state of optical fibers varies as wavelength of light due to the polarization mode dispersion. Polarization-state of different wavelengths continuously changes and polarization-state gets scrambled as light advances through an optical fiber. As light advances through a long optical fiber, a birefringence axis rotates without balance and polarization components are mutually coupled. Therefore, input light supplied to an optical fiber advances without regard to polarization-state and polarization gets scrambled. Polarization scrambling level depends upon the amount of birefringence and the extent of cross coupling of polarization components. In optical fibers with large polarization mode dispersion, dependency between the pump beam 41a and the signal beam 41b does polarization scrambling in four-wave-mixing stage and polarization mode dispersion reduces.

As shown in FIG. 1, either a mode-locked erbium doped optical fiber laser or a mode-locked semiconductor laser may be used as a signal beam 41b. The difference between the oscillation wavelength of the signal beam 41b and the zero dispersion wavelength of the dispersion-shifted fiber 12 is only few nanometers.

The pump beam 41a also has substantially same wavelength with the zero dispersion wavelength of the dispersion-shifted fiber 12. In experiments, when the zero dispersion wavelength of the dispersion-shifted fiber 12 was 1544.5 nm, a 2.5-Gbit/s DFB laser diode of 1544.5 nm was used as a pump beam source, in which the resulted pulse width was approximately 30 ps. A 10-GHz mode-locked optical fiber laser of 1546.8 nm was used as a signal beam source, in which the resulted pulse width was approximately 10 ps.

In order to increase the output of the pump beam 41a and the signal beam 41b, the first optical amplifier 51a and the second optical amplifier 51b amplify them, respectively. After passing through the first optical amplifier 51a and the second optical amplifier 51b, output optical signals of the pump beam 41a and the signal beam 41b were adjusted to be around 10 mW. Then, they were respectively supplied to the first band pass filter 52a and the second band pass filter 52b for ASE noise removal. The polarization controller 54 inserted between the first band pass filter 52a and the 3-dB optical fiber coupler 31 changes polarization-state of input light. The pump beam 41a and the signal beam 41b were combined by the 3-dB optical fiber coupler 31 and were passed through the dispersion-shifted fiber 12 that has 10-km length and a large polarization mode dispersion. Polarization-state of the pump beam 41a and the signal beam 41b got scrambled as they advance through the dispersion-shifted fiber 12. A constant four-wave-mixing beam was obtained without regard to the input polarization-state. In other words, when four-wave-mixing occurred in an optical fiber that has large polarization mode dispersion, it is hard to find the difference between the maximum signal value and the minimum signal value of polarization components. On the contrary, when four-wave-mixing occurred in an optical fiber that has fairly small polarization mode dispersion, the difference between the maximum signal value and the minimum signal value of polarization components was approximately 15 dB. Therefore, if an optical fiber that has large polarization mode dispersion is used, a constant four-wave-mixing beam is obtained without regard to the input polarization-state and thereby demultiplexed signals are obtained independent of polarization.

In this experiment, the zero dispersion wavelength of the dispersion-shifted fiber 12 was 1544.5 nm. The third band pass filter 52c measured the demultiplexed signals at the output stage. A 10-GHz signal beam 41b got synchronized with a 2.5-GHz pump beam 41a with respect to the time axis and a new signal was generated by four-wave-mixing and this signal was demultiplexed by the third band pass filter 52c.

Among 10-GHz components of signal beam 41b, only 2.5-GHz components were employed to generate a new signal by four-wave-mixing, and thereby the 2.5-GHz components is considered as a signal demultiplexed from the 10-GHz components. For example, when the wavelength of the signal beam 41b is 1546.8 nm and the wavelength of the pump beam 41b is 1544.4 nm, the generated four-wave-mixing beam by the dispersion-shifted fiber 12 has components of 1542 nm and 1549.2 nm wavelengths.

Figure 2:
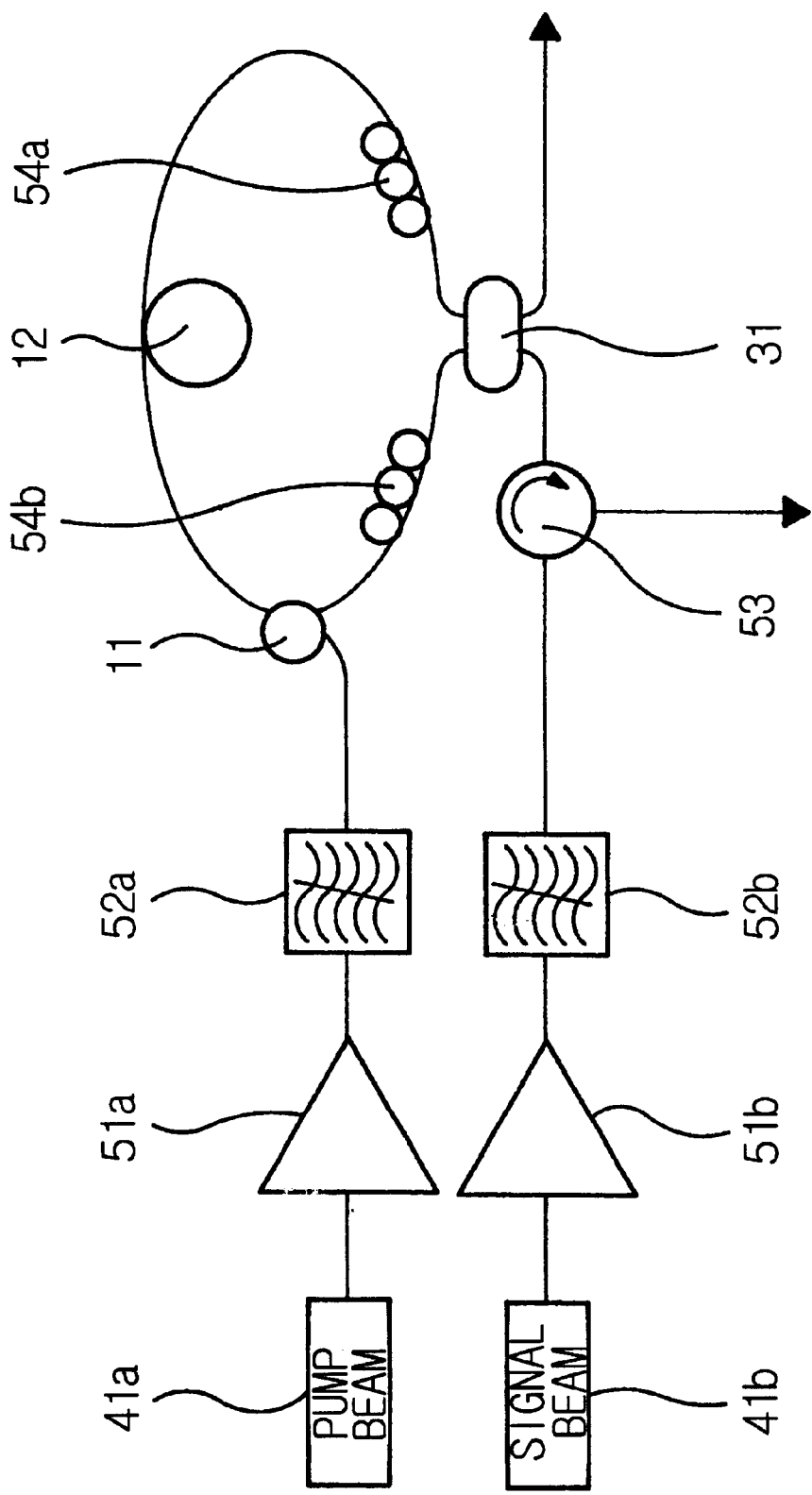
FIG. 2 shows a block diagram for explaining a polarization-independent optical demultiplexer in accordance with the second embodiment of the present invention.

Referring to FIG. 2, a polarization-independent optical demultiplexer in the second embodiment will be explained.

As shown in the figure, the polarization-independent optical demultiplexer includes input beams, a first optical amplifier 51a, a second optical amplifier 51b, a first band pass filter 52a, a second band pass filter 52b, a WDM optical coupler 11, a dispersion-shifted fiber 12, a first polarization controller 54a, a second polarization controller 54b, a 3-dB optical fiber coupler 31, and an optical circulator 53. The Input beams comprise a pump beam 41a and a signal beam 41b. The first optical amplifier 51a and the second optical amplifier 51b amplify the pump beam 41a and the signal beam 41b, respectively. The first band pass filter 52a and the second band pass filter 52b remove noises from the amplified spontaneous emission. The WDM optical coupler 11 divides the output optical signals of the first band pass filter 52a into a first optical signal and a second optical signal. The dispersion-shifted fiber 12 generates a constant four-wave-mixing beam without regard to the input polarization-state of the first optical signal from the WDM optical coupler 11. The first polarization controller 54a controls polarization of the four-wave-mixing beam generated by the dispersion-shifted fiber 12. The second polarization controller 54b controls polarization of the output optical signal from the WDM optical coupler 11. The 3-dB optical fiber coupler 31 combines optical signals of the first polarization controller 54a and the second polarization controller 54b to produce a first optical signal and a second optical signal. The optical circulator 53 makes an output while circulating the first optical signal from the 3-dB optical fiber coupler 31 and the output optical signal of the second band pass filter 52b.

The operation of the polarization-independent optical demultiplexer in the second embodiment is explained as follows.

First of all, operations of the pump beam 41a, the signal beam 41b, the first optical amplifier 51a, the second optical amplifier 51b, the first band pass filter 52a and the second band pass filter 52b in the second embodiment are same as operations of the first embodiments.

The output optical signal of the first band pass filter 52a is divided into the first optical signal and the second optical signal through the WDM coupler 11.

The first optical signal of the WDM coupler 11 is passed through the dispersion-shifted fiber 12 that has 10-km length and a large polarization mode dispersion. As shown in the first embodiment, a constant four-wave-mixing beam is obtained without regard to the input polarization-state.

The first polarization controller 54a controls polarization of the four-wave-mixing beam generated by the dispersion-shifted fiber 12. The second polarization controller 54b controls polarization of the output optical signal from the WDM optical coupler 11. The output optical signal of the first polarization controller 54a and the output optical signal of the second polarization controller 54b are combined by the 3-dB optical fiber coupler 31 and the combined signal is divided into the first optical signal and the second optical signal. The optical signal of the 3-dB optical fiber coupler 31 and the output optical signal of the second band pass filter 52b are circulated by the optical circulator 53.

The main objective of the present invention is to obtain a constant four-wave-mixing beam without regard to the input polarization-state and thereby implement an efficient polarization-independent optical demultiplexer.

Although the preferred embodiments of the present invention have been disclosed for illustrative purposes, those skilled in related art will appreciate that various modifications, additions and substitutions are possible, without departing from the scope and spirit of the invention as recited in the accompanying claims.

What is claimed is:

1. A polarization-independent optical demultiplexer with four-wave-mixing comprising:

input beams including a pump beam and a signal beam:

a first optical amplifier and a second optical amplifier for amplifying said input beams, respectively;

a first band pass filter and a second band pass filter for removing noises from the amplified spontaneous emission;

a 3-dB optical fiber coupler for combining the output signals of said first and second band pass filters and generating two optical signals;

a dispersion-shifted fiber for generating a constant four-wave-mixing beam without regard to an input polarization state by making polarization state of the output signal of said 3-dB optical fiber coupler scrambled; and a third band pass filter for demultiplexing a four-wave-mixing beam generated by said dispersion-shifted fiber.

2. The polarization-independent optical demultiplexer according to claim 1, wherein said demultiplexer further comprises a polarization controller for controlling polarization output optical signals of said first and second band pass filters.

3. The polarization-independent optical demultiplexer according to claim 1, wherein said signal beam is either a mode-locked erbium doped optical fiber laser or a mode-locked semiconductor laser.

4. The polarization-independent optical demultiplexer according to claim 1, wherein the wavelength of said pump beam is same as the zero dispersion wavelength of said dispersion-shifted fiber.

5. The polarization-independent optical demultiplexer according to claim 1, wherein said dispersion-shifted fiber synchronizes a 10-GHz signal beam with a 2.5-GHz pump beam with respect to time axis and thereby generates the four-wave-mixing beam.

6. A polarization-independent optical demultiplexer with four-wave-mixing comprising:

input beams including a pump beam and a signal beam;

a first optical amplifier and a second optical amplifier for amplifying said input beams, respectively;

a first band pass filter and a second band pass filter for removing noises from the amplified spontaneous emission;

a WDM optical coupler for dividing the output optical signals of said first band pass filter into a first optical signal and a second optical signal;

a dispersion-shifted fiber for generating a constant four-wave-mixing beam without regard to an input polarization state of said first optical signal from said WDM optical coupler;

a 3-dB optical fiber coupler for combining the four-wave-mixing beam generated by said dispersion-shifted fiber with the second optical signal of said WDM optical coupler and generating a first optical signal and a second optical signal; and an optical circulator for making an output while circulating the first optical signal of said 3-dB optical fiber coupler and the output optical signal of said second band pass filter.

7. The polarization-independent optical demultiplexer according to claim 6, wherein said demultiplexer further comprises:

a first polarization controller for controlling polarization of said four-wave-mixing beam generated by said dispersion-shifted fiber; and a second polarization controller for controlling polarization of the output optical signal from said WDM optical coupler.

8. The polarization-independent optical demultiplexer according to claim 6, wherein said signal beam is ether a mode-locked erbium doped optical fiber laser or a mode-locked semiconductor laser.

9. The polarization-independent optical demultiplexer according to claim 6, wherein the wavelength of said pump beam is same as the zero dispersion wavelength of said dispersion-shifted fiber.

10. The polarization-independent optical demultiplexer according to claim 6, wherein said dispersion-shifted fiber synchronizes a 10-GHz signal beam with a 2.5-GHz pump beam with respect to time axis and thereby generating said four-wave-mixing beam.

* * * * *